United States Patent [19]
Lin et al.

[11] Patent Number: 5,661,591
[45] Date of Patent: *Aug. 26, 1997

[54] OPTICAL SWITCH HAVING AN ANALOG BEAM FOR STEERING LIGHT

[75] Inventors: Tsen-Hwang Lin; Philip A. Congdon; Gregory A. Magel, all of Dallas; James M. Florence, Richardson, all of Tex.; Robert Mark Boysel, Hopewell Jct, N.Y.

[73] Assignee: Texas Instruments Incorporated, Dallas, Tex.

[ * ] Notice: The term of this patent shall not extend beyond the expiration date of Pat. No. 5,629,794.

[21] Appl. No.: 537,179

[22] Filed: Sep. 29, 1995

[51] Int. Cl.$^6$ ..................... G02B 26/00
[52] U.S. Cl. .............. 359/290; 359/214; 359/850
[58] Field of Search ................... 359/290, 291, 359/212, 213, 214, 846, 847, 848, 849, 850, 851

[56] References Cited

U.S. PATENT DOCUMENTS 5,489,952  2/1996  Gove et al. .................. 348/771

*Primary Examiner*—Georgia Y. Epps
*Assistant Examiner*—Dawn-Marie Bey
*Attorney, Agent, or Firm*—Robert C. Klinger; James C. Kesterson; Richard L. Donaldson

[57] ABSTRACT

A spatial light modulator (40,70,80,90,130) operable in the analog mode for light beam steering or scanning applications. A deflectable mirror (42, 72) and which may be hexagonal (92, 132) is supported by a torsion hinge (44,86, 94) ends along a torsion axis. A plurality of flexure hinges (48,82,106) are provided to support the ends of the mirror (42,72,92,132) and provide a restoration force. The combination of the torsion hinges and the flexure hinges realizes a deflectable pixel that is operable in the linear range for a large range of address voltages. The flexure hinges also maintain a flat undeflected state when no address voltage is applied, and prevent the pixel from collapsing. The pixel may be reinforced, such as about its perimeter (74) to ensure mirror flatness and prevent warping, even during extreme deflections of the mirror. The pixel is electrostatically deflected by applying an address voltage to an underlying address electrode (60,96,98). The hexagonal mirrors (92, 132) allow a tightly packed mirror array, and have a closely circular surface area so as to efficiently reflect a light beam of circular cross section, such as a light beam from fiber optics.

16 Claims, 9 Drawing Sheets

45° FLAP

90° FLAP

DIVING BOARDS

45° EXTENDED HINGE

90° EXTENDED HINGE

OPTICAL SWITCH HAVING AN ANALOG BEAM FOR STEERING LIGHT

CROSS REFERENCE TO RELATED APPLICATIONS

Cross reference is made to the following commonly-assigned co-pending patent applications, the teachings of which are incorporated herein by reference.

| Ser. No. | TITLE | FILING DATE |
| --- | --- | --- |
| 08/414,831 | Spatial Light Modulator with Superstructure Light Shield | 03-31-95 |
| 08/097,824 | Microminiature, Monolithic, Variable Electrical Device and Apparatus Including Same | 07-27-93 |
| 08/424,021 | Active Yoke Hidden Hinge Digital Micromirror Device | 04-18-95 |
| 08/171,303 | Multi-Level Digital Micromirror Device | 12-21-93 |
| 08/482,477 | Method and Device for Multi-Format Television | 06-07-95 |
| 08/455,475 | Spatial Light Modulator Having an Analog Beam for Steering Light | |
| 08/424,021 | Active Yoke Hidden Hinge Digital Micromirror Device | 04-18-95 |

FIELD OF THE INVENTION

The present invention is generally related to spatial light modulators for modulating incident light and suitable as an optical switch, and more particularly, to a device having a selectively deflectable mirror being supported by at least one hinge for steering incident light in a direction being a function of the degree to which the mirror is deflected.

BACKGROUND THE INVENTION

Spatial light modulators (SLM's) have found numerous applications in the areas of optical information processing, projection displays, video and graphics monitors, televisions, and electrostatic printing. SLM's have also found uses as optical switches, optical shutters, light valves, pixel steerers and so forth. SLM's are devices that modulate incident light in a spatial pattern to form a light image corresponding to an electrical or optical input. The incident light may be modulated in its phase, intensity, polarization, and/or direction. The light modulation may be achieved by a variety of materials exhibiting various electro-optic or magneto-optic effects, and by materials that modulate light by surface deformation.

The present invention relates to SLM's of the foregoing type which may be used in a variety of devices, including light switches, light valves, pixel steerers and optical shutters.

A recent innovation of Texas Instrument Incorporated of Dallas, Tex. is the digital micromirror device or deformable mirror device, collectively known as the DMD. The DMD is a spatial light modulator comprising a monolithic single-chip integrated circuit, typically having a high density array of 17 micron square deflectable micromirrors but may have other dimensions. These mirrors are fabricated over address circuitry including an array of memory cells and address electrodes. The mirrors may be bistable and be operated in the digital mode, the mirror being stable in one of two deflected positions. A source of light directed upon the mirror is reflected in one of two directions by the mirror. When used in the digital mode, incident light from the array of mirrors can be modulated and directed to a projector lens and then focused on a display screen or a photoreceptor drum to form a light image. When the mirror is in one position, known as the "on" position, light is directed into the projector lens. In the other position, known as the "off" mirror position, light is directed to a light absorber. The DMD may also be monostable and operated in the analog mode, and finds use as a light switch, pixel steerer, optical shutter, scanner, and the like.

For a more detailed discussion of the DMD device and systems incorporating the device, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention, and the teachings of each are incorporated herein by reference. Gray scale of the pixels forming the image may be achieved by pulse width modulation techniques of the mirrors, such as that described in U.S. Pat. No. 5,278,652, entitled "DMD Architecture and Timing for Use in a Pulse-Width Modulated Display System", assigned to the same assignee of the present invention, and the teachings of each are incorporated herein by reference.

Commonly assigned U.S. Pat. No. 4,662,746 to Hornbeck entitled "Spatial Light Modulator and Method", U.S. Pat. No. 4,710,732 to Hornbeck entitled "Spatial Light Modulator and Method", U.S. Pat. No. 4,956,619 to Hornbeck entitled "Spatial Light Modulator", and U.S. Pat. No. 5,172,262 to Hornbeck entitled "Spatial Light Modulator and Method" disclose various structures and methods of producing micro mechanical devices, specifically, monostable DMD SLM's suited for use in the analog mode, the teachings of each incorporated herein by reference.

Commonly assigned U.S. Pat. No. 5,096,279 to Hornbeck et al. entitled "Spatial Light Modulator and Method", U.S. Pat. No. 5,142,405 to Hornbeck entitled "Bistable DMD Addressing Circuit and Method", and U.S. Pat. No. 5,212,582 to Nelson entitled "Electrostatically Controlled Pixel Steering Device and Method" disclose various structures and methods for producing the same that are bistable and suited for use in the digital mode, the teachings of each incorporated herein by reference.

Referring to FIGS. 1A–1H, these embodiments being disclosed in a commonly assigned U.S. Pat. No. 5,172,262, there is shown a monostable DMD spatial light modulator that can be operated in the analog mode. One pixel, generally denoted at 20, is basically a flap covering a shallow well and includes a silicon substrate 22, a spacer 24, a hinge layer 26, a pixel layer 28, a flap 30 formed in layers 26–28, and plasma etch access holds 32 in flap 30. The portion 34 of hinge layer 26 that in not covered by pixel layer 28 forms a hinge attaching flap 30 to the portion of layers 26–28 supported by spacer 24. Pixel 20 is fabricated using a robust semiconductor process upon silicon substrate 22. Spacer 24 may be an insulating positive photoresist or other polymer, hinge layer 26 and pixel layer 28 are both an aluminum, titanium and silicon alloy (Ti: Si: Al), although these layers could also comprise of titanium tungsten, or other suitable materials. The hinge layer 34 may be about 800 Angstroms thick, wherein the pixel 30 is much thicker to avoid cupping and warping, and may have a thickness of about 3,000 Angstroms.

Pixel 20 is operably deflected by applying a voltage between mirror 30 and an underlying address electrode 36 defined on substrate 22. Flap 30 and the exposed surface of electrode 36 form the two plates of an air gap capacitor, and the opposite charges induced on the two plates by the applied voltage exert electrostatic force attracting flap 30 to substrate 22. This attractive force causes flap 30 to bend at hinge 34 and be deflected toward substrate 22. Depending on the opposing surface area of the electrodes, the spacing therebetween, the differential voltage applied, and the compliance of hinge 34, the degree of deflection of mirror 30 will vary. The deflection of mirror 30 is a function of the differential voltage, as graphically illustrated in FIG. 1C. As shown, the greater the differential voltage, that is, the greater the voltage applied to mirror 30, the greater the degree of deflection.

As also illustrated in FIG. 1C, this deflection is nonlinear, and is not proportional to the voltage applied. A linear response, which may be the ideal response, is shown by the dotted line generally depicted at 38. The nonlinear relationship is due to many reasons. First, the electrostatic force is a function of the inverse of the square of the distance separating the mirror 30 and address electrode 36. Secondly, the geometry and composition of the hinge affects the compliance of hinge 34. The thickness of mirror 30 prevents significant warping, but the thinness of hinge 34 allows for large compliance. The deflection of flap 30 is a highly nonlinear function of the applied voltage because the restoring force generated by the bending of hinge 34 is approximately a linear function of the deflection, but the electrostatic force of attraction increases as the distance between the closest corner of flap 30 and electrode 36 decreases. Recall that the capacitance increases as the distance decreases so the induced charges both increase in quantity and get closer together. As shown in FIG. 1C, the voltage at which mirror 30 becomes unstable and bends all the way to touch and short with electrode 36 is called the collapse voltage. The analog operating region is that region between zero deflection and the collapsed situation.

FIG. 1D-1H illustrate equivalent alternative embodiments of the cantilever or leaf-type mirror 30 shown in FIG. 1.

When operating a spatial light modulator, such as of the type just discussed and referenced in FIG. 1A-1H, it may be desired to operated the deflectable member in the analog region, whereby the angle of deflection of mirror 30 is linearly proportional to the voltage applied. To operate the device as a light beam steerer, scanner, or light switch, it is desirable to precisely control the degree of deflection as so to precisely steer incident light to a receiver, such as a sensor. Therefore, in prior art designs, such as that shown in FIGS. 1A-1H, it is imperative that a repeatable process be followed. In the practical world, however, process tolerances allow for some deviation form device to device. Thus, for a given voltage being applied to address electrode 36, the deflection of mirror 30 from device to device will vary slightly. Consequently, characterization of the device prior to implementation is necessary when the device is used in the analog mode.

It is desired to provide a spatial light modulator suitable for use as an optical switch with a deflectable pixel well suited to be used in the analog mode.

SUMMARY OF THE INVENTION

The present invention achieves technical advantages as a spatial light modulator by providing a hexagon-shaped pixel supported by both a torsion hinge and at least one flexure hinge. The torsion hinges define the tilt axis, and the flexure hinges define the flat position and provide a restoring force to achieve enlarged stable range of tilt angles. Through the combination of these hinges, the pixel is nearly monostable and will resist collapse. The hexagon pixel structure allows the pixels to be tightly arranged in an array, the hexagon pixel geometry also being suitable to reflect circular light beams such as those from fiber optics.

The present invention comprises a spatial light modulator of the type which includes a generally planar hexagonal light-reflecting pixel, i.e. mirror, which is deflectable out of a first, normal position into a plurality of second positions. Light incident on the pixel is selectively modulated by being reflected from the pixel in selected directions, depending on the position of the pixel. The position of the pixel is dependent on a selected characteristic of an electrical signal, such as a voltage applied to an underlying address electrode. The deflection of the pixel stores potential mechanical energy in a pixel-supporting facility, this stored energy tending to return the pixel to the first, horizontal normal position. Preferably, this pixel-supporting facility includes a first torsion hinge connected between the pixel and the first stationary post and defining a torsion axis. Deflection of the pixel effects its rotation about the torsional axis of the first hinge. At least one second flexure hinge is connected between the pixel and a second stationary post. Deflection of the pixel effects the flexure of the second hinge. By providing two types of hinges, deflection of the pixel is controllable for a large deflection range, and approximately proportional to the electrical signal applied to the underlining address circuit, preferably being an electrode. The pixel is monostable and cannot collapse on the address electrode, unless of course, large address voltages are provided. The hexagonal geometry of the pixel is suited to reflect circular light beams, such as those from fiber optics, while permitting a tightly packed arrangement of pixel mirrors. Excellent accuracy of the pixel mirror tilt angle for light steering is achieved, with the second hinge providing a well-defined undeflected (flat) position. Both the first hinge and the second hinge provide a restoration force.

The points of connection of the first and second hinges to the pixel are separated about the perimeter of the pixel. The pixel has a generally orthogonal profile, with the first hinge being connected to the pixel at a mid-point of a first side thereof. The second hinge may be connected to the first side of the pixel as well in one embodiment. The second hinge may be connected to the pixel proximate the juncture of the first side of pixel and a second side of the pixel. The second hinge may also be connected to the second side of the pixel including the most distal portion of the pixel, from the torsional axis. The torsional axis of the first hinge is generally co-planar with the pixel, and the second hinge in its unflexed state is oriented so as to be generally co-planar with the pixel and perpendicular to the torsional axis of the first hinge. The second hinge in its flexed state may define a curved or slightly twisted surface at its corner, such that each end remains co-planar with the surface to which it is attached.

The characteristic of the first hinge is such that the deflection of the pixel out of the first position is predominantly rotational about the torsion axis. The characteristic of the second hinge is such that the first position of the pixel is predominantly determined by the second hinge. The characteristics of both the hinges are such that the pixel is selectively deflectable out of the first position into a plurality of second positions determined by the selected characteristic of the electrical signal. The first and second hinges are respectively connected to the separated first and second posts. In an alternative embodiment, the first and second hinges may be connected to the same post. The pixel may be reinforced to maintain flatness when undeflected, and when deflected out of the first position. Preferably, the reinforcement may comprise the perimeter of the pixel being corrugated or ridged to provided rigidity and minimize interfering with incident light being modulated. Alternatively or additionally, cupping of the pixel may be minimized by providing radial corrugations or ridges.

DETAILED DESCRIPTION OF THE INVENTION

Figure 1A:
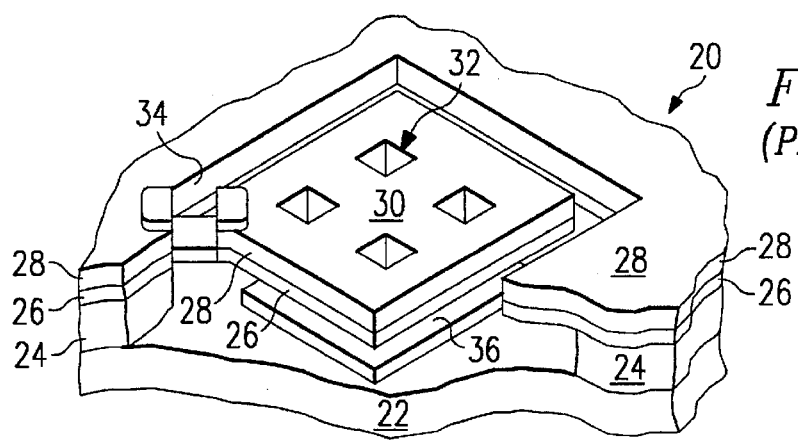
FIGS. 1A–1H illustrate a prior art cantilever-type spatial light modulator, including a deflectable pixel deflectable as a function of an address voltage applied to an underlying address electrode.
Figure 1B:
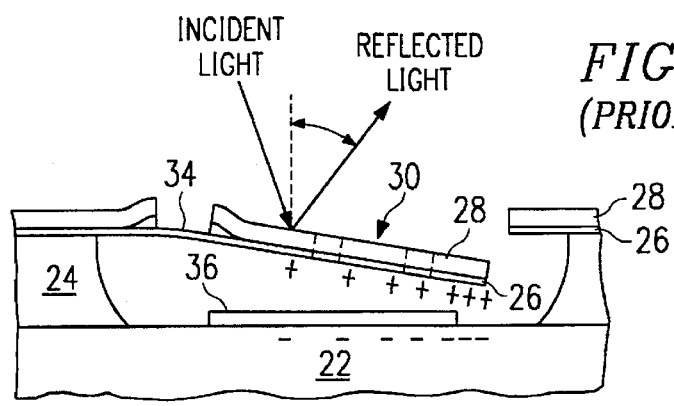
Figure 1C:
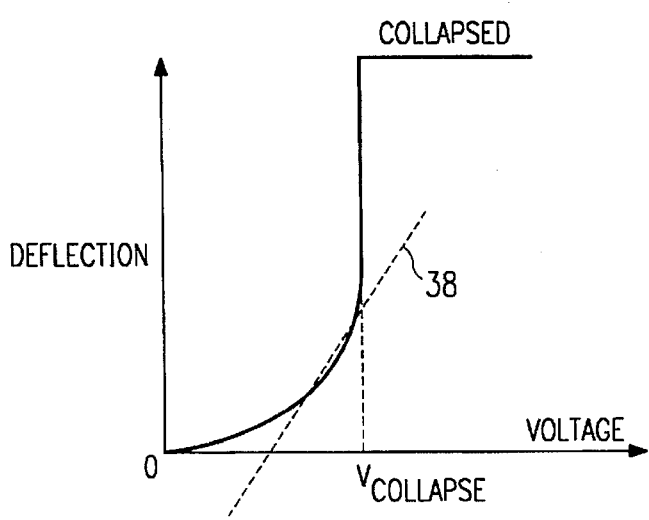
Figure 1D:
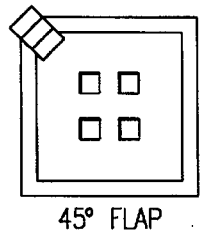
Figure 1E:
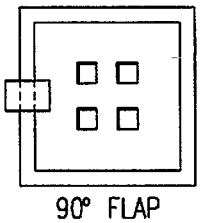
Figure 1F:
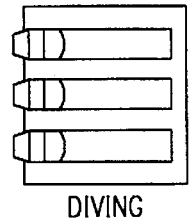
Figure 1G:
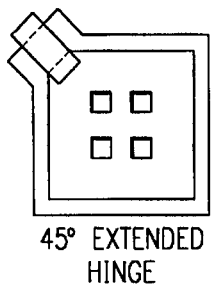
Figure 1H:
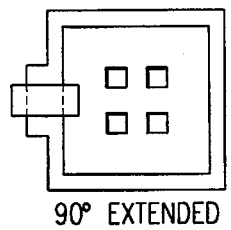
Figure 2:
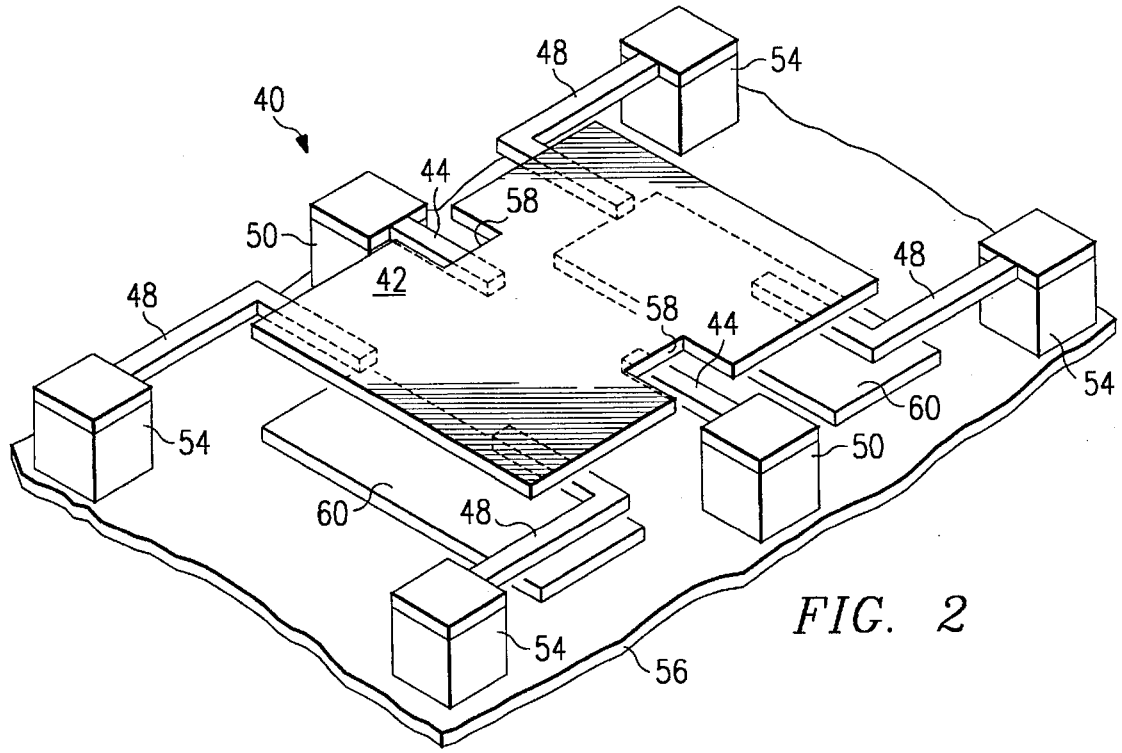
FIG. 2 is a perspective view of a spatial light modulator according to the present invention including a deflectable pixel supported both by a torsion hinge, and at least one flexure hinge connected proximate the corners thereof.

Referring to FIG. 2, there is generally shown at 40 a monostable spatial light modulator according to the preferred embodiment of the present invention. SLM 40 is well suited to operate in the analog mode to selectively steer incident light in a direction being a function of an electrical input. The deflection of the SLM may be generally linear or nonlinear, as a function of the input electrical signal. The pixel resists collapse on its underlying address electrode due to the unique combination of hinges.

SLM 40 is a micromechanical structure formed using robust semiconductor processing. SLM 40 is seen to comprise a generally rectangular reflective aluminum pixel 42 being supported along its mid section by a pair of torsional hinges 44. Hinges 44 essentially bisect the mirror 42 and define a torsional axis therealong. Mirror 42 is also seen to be supported proximate each corner thereof by an L-shaped flexure-type hinge 48. Torsional hinges 44 extend from and are supported by a respective electrically conductive post 50, with the flexure hinges 48 being supported by a respective electrically conductive post 54. Each of posts 50 and 54 are supported upon a silicon substrate 56, this substrate 56 also supporting a pair of electrically conductive address electrodes 60. Each of address electrodes 60 are connected to underlining address circuitry fabricated within substrate 56 (not shown). Hinges 44 connect to mirror 42 in a pair of opposed notches 58, notches 58 permitting long and compliant hinges 44. While the hinges, mirror and support posts are preferably comprised of electrically conductive material, each or all could also be comprised of electrically nonconductive material with the pixel having a light-reflective coating if desired. Hinges 48 could also have a serpentine shape, or be linear if desired. Hinges 48 could connect to pixel mirror 42 or either side proximate the corner of the adjoining sides, and limitation to the illustrated shapes of hinges 48 is not to be inferred.

Figure 3A:
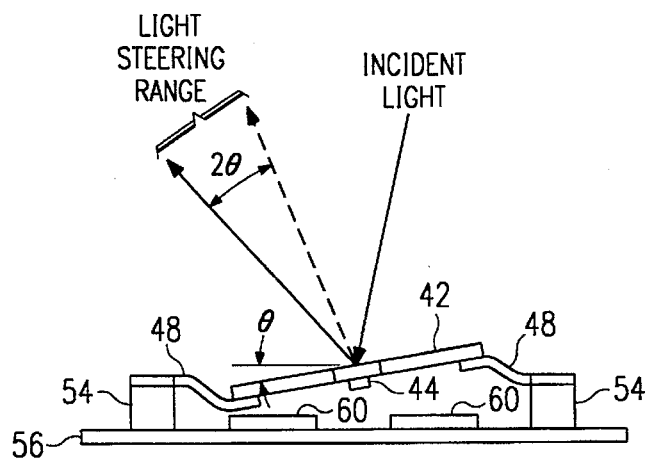
FIG. 3A is a side view of the SLM of FIG. 2 with the torsion hinge posts removed, illustrating the pixel being deflected about the torsion hinge to steer incident light in a selected direction, the deflection of the pixel being a function of the voltage applied to the underlying address electrode.

Referring to FIG. 3A the angular deflection of mirror 42 about the torsional axis defined by hinges 44 is seen to be a function of the voltage potential applied to one of the address electrodes 60. With a bias voltage being applied to mirror 42 via posts 54 and hinges 48, and an address potential being applied to one of the two address electrodes 60, this voltage potential induces an electrostatic attraction between the mirror 42 and the underlying address electrode 60, thus creating an angular deflection of mirror 42, as shown. Torsional hinges 44 rotate or twist with mirror 42 and provide restoring force in the form of a mechanical energy. Each of the four flexure hinges 48 also provide a restoring force, and deform or flex, as shown, when mirror 42 deflects about the torsional axis defined by hinges 44. Hinges 48 also provide restoring force in the form of mechanical energy, and define a normal flat or undeflected position when no voltage potential exists.

Figure 3B:
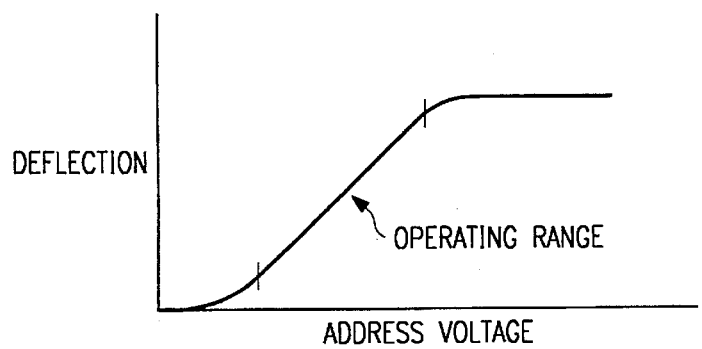
FIG. 3B is a graph illustrating the linear deflection of the mirror as a function of the addressed voltage.

By way of illustration but with no limitation to the following dimensions or shapes, torsional hinges 44 are preferably comprised of a compliant material such as aluminum, an aluminum alloy or titanium tungsten, each having a thickness of about 500 Angstroms. Each of flexure hinges 48 are also comprised of a compliant metal, such as aluminum, an aluminum alloy, or titanium tungsten, each having a thickness of about 500 Angstroms. The length of each hinge 48 is approximately 10 microns. Each hinge 48 extends from the respective post 54 a substantial length towards a respective torsional hinge 44 and is perpendicular therewith. Each flexure hinge 48 has a 90° bend proximate mirror 42, and is connected to the corner of pixel 42, at the juncture of two adjacent sides, as shown. The short segment of hinge 48 insures that a majority of the flexure of hinge 48 is along the major length, with any twisting taking place at the corner thereof. With the hinge 48 being about 500 Angstroms in thickness and having a length of about 10 microns, the flexure of these hinges permits mirror 42 to deflect as a function of the voltage potential provided to one address electrode 60, as shown in FIG. 3A. The spacing of mirror 42 from electrodes 60 is about 1–10 microns. This analog operating range is represented as angle θ, as shown in FIG. 3A. This corresponds to an input voltage of between 0 and 20 volts. As pixel 42 deflects angle θ, incident light is steered through a range of 2θ, as shown in FIG. 3A. As expected due to optical light properties, the angular range that incident light can be reflected is double the angular deflection of the pixel 42. In the present invention, pixel 42 can be deflected with a linear or non-linear response, depending on the design, up to angle being about 10°. Thus, the range of steering light is 20°. The response curve of mirror 42 as a function of address voltage is shown in FIG. 3B.

With an address voltage being applied to one address electrode 60 being from 0 to 20 volts, mirror 42 is deflected proportional to the address voltage. When SLM 40 is operated as an optical switch or light steerer, incident light can be precisely steered to a receiver such as an optical sensor or scanner. The mirror tilt angle can be achieved with a excellent accuracy for pixel steering. The torsion hinges 44 define the tilt axis, whereby the flexure hinges 48 help achieve a controlled response and maintain mirror levelness when not addressed (undeflected). Both the torsion hinges and flexure hinges provide a mechanical restoration force and achieve a stable tilt range. With two flexure hinges 48 being provided each side of the torsion axis, there is little possibility of a collapsed mirror, unless one of the hinges should break, which is not likely given the range of operable address voltages provided to address electrode 60. Compliance of each of flexure 48 and torsion hinges 44 is excellent.

Figure 4:
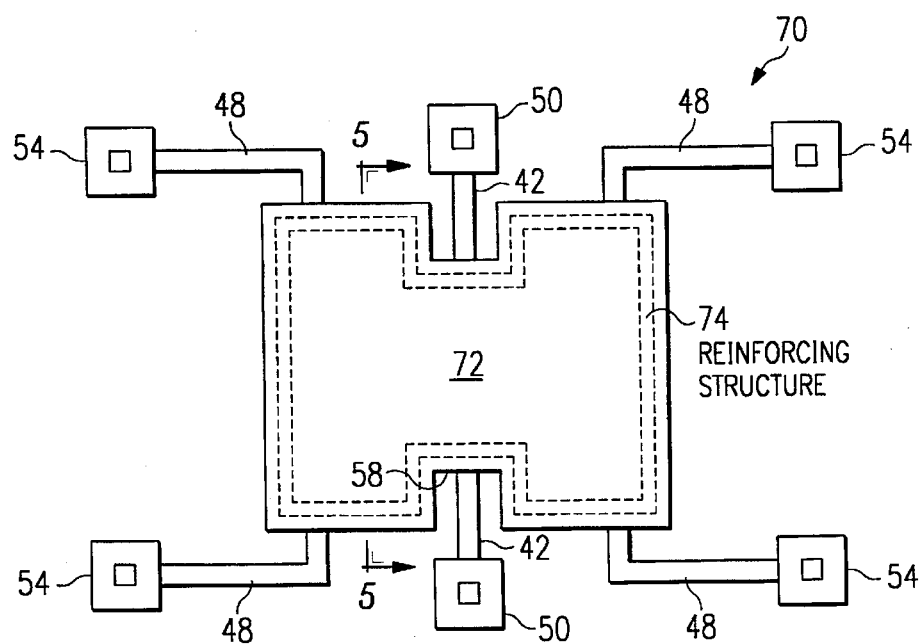
FIG. 4 is a top view of an alternative preferred embodiment of the pixel shown in FIG. 2, whereby the perimeter of the pixel is reinforced to insure the pixel is flat, rigid, and remains unflexed, even when pivoted about the torsional axis.
Figures 5, 6:
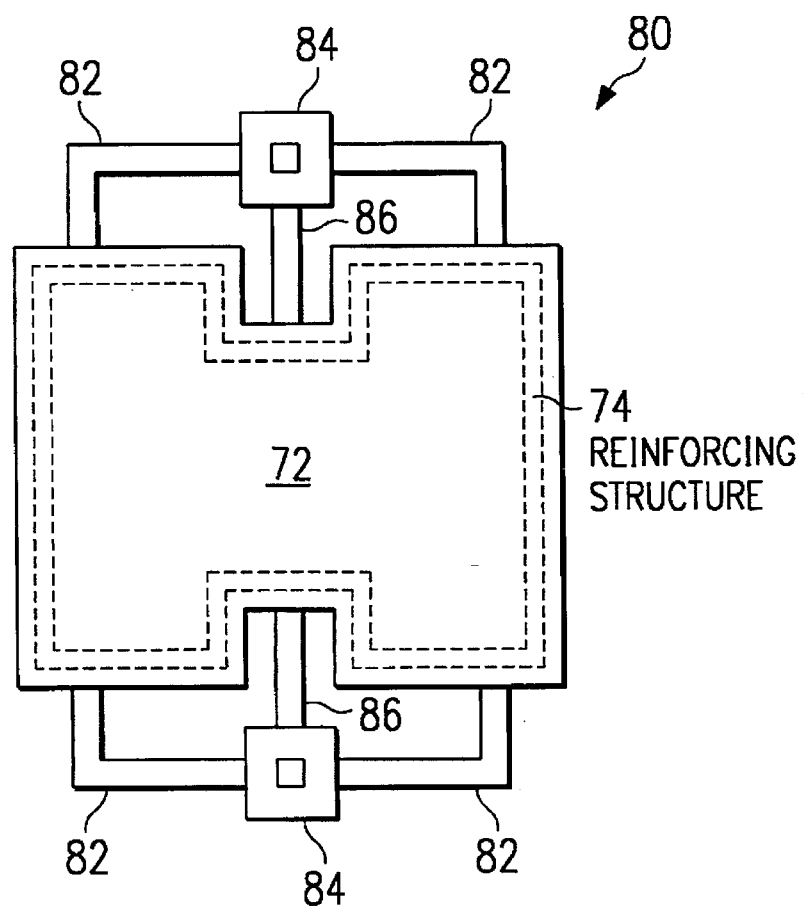
FIG. 5 is a cross section taken along line 5—5 in FIG. 4, illustrating the reinforcing structure of the pixel comprising the pixel being corrugated about the perimeter.
FIG. 6 is a top view of yet another alternative preferred embodiment wherein the torsion hinges and flexure hinges are supported by a common post.

Referring now to FIG. 4, a top view of an alternative preferred embodiment of the present invention is shown as SLM 70, with a modified mirror 72 is shown, wherein like numerals refer to like elements of the first embodiment. To ensure that mirror 72 remains flat and does not warp, even in an extreme deflected state, the perimeter of mirror 72 is reinforced. This reinforcement preferably is achieved by corrugating the perimeter of the mirror, shown as a trench shown at 74. Referring to FIG. 5, a cross section of mirror 42 taken along line 5—5 in FIG. 4 illustrates how mirror 42 is corrugated about the perimeter thereof. The trench 74 in the metal is one reliable way to reinforce mirror 72 to prevent warping or cupping, even when deflected about the torsion axis. Other equivalent methods of reinforcing could include increasing the thickness of mirror 72 about the perimeter thereof, like a rib or ridge, and grid:

Referring now to FIG. 6, another alternative embodiment of the present invention is shown, as SLM 80, wherein like numerals refer to like elements. Each of flexure hinges 82 are connected to one of posts 84 from which torsion hinges 86 extend. This embodiment requires only two support posts as compared to the six support posts shown in FIG. 2. Again, each of the flexure hinges 82 extend from the respective posts 84 and connect to one corner of mirror 72, proximate the juncture of two adjacent sides. All the hinges provide a restoration force to return the mirror to a flat, undeflected state when no address voltage is applied to address electrode 60. This embodiment permits a higher fraction of optically active surfaces since SLM elements can be placed closer together.

Figure 7:
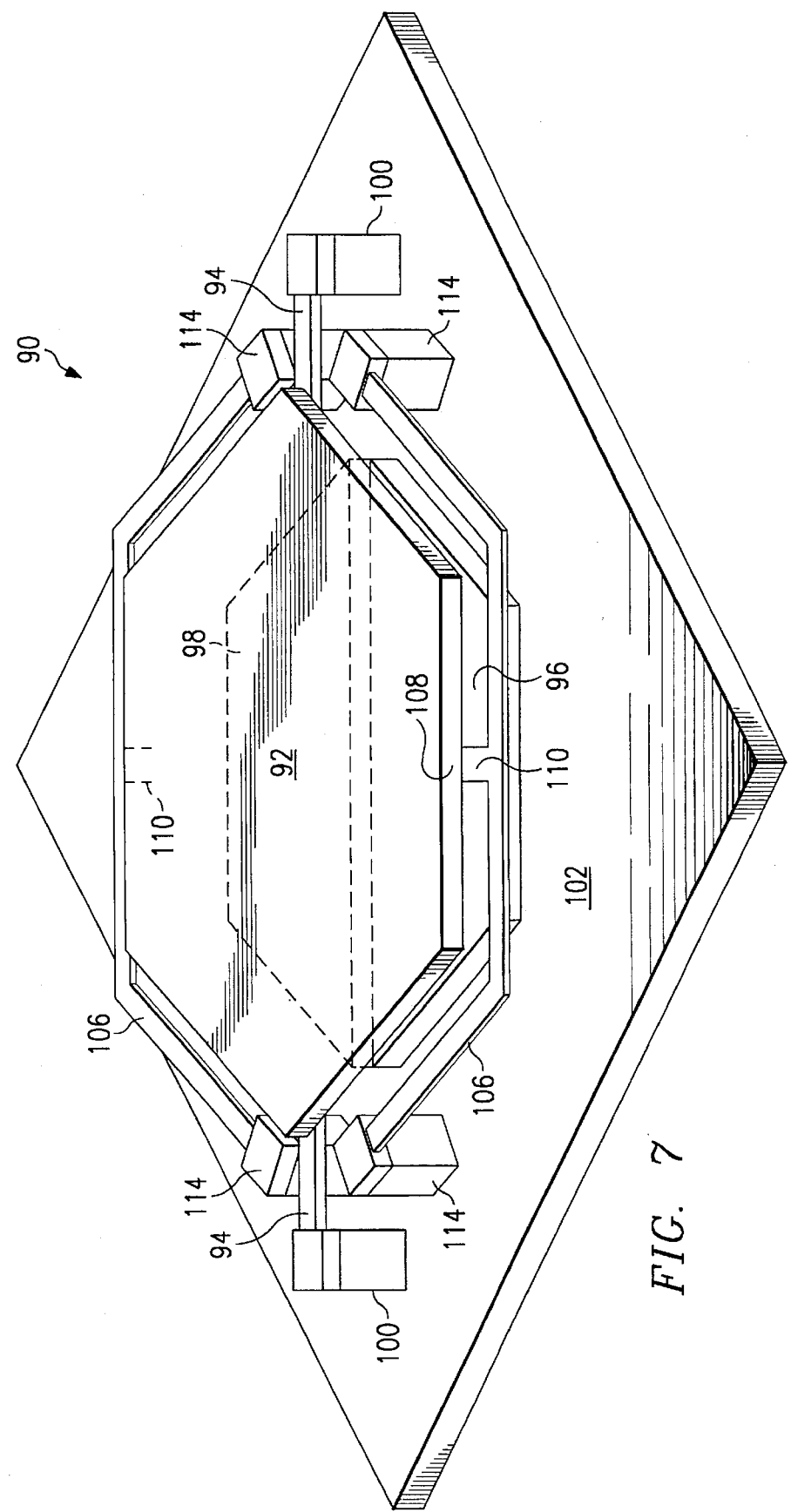
FIG. 7 is a perspective view of a spatial light modulator according to an alternative preferred embodiment of the invention including a hexagon-shaped pixel supported by a pair of torsion hinges, and a pair of flexure hinges.

Referring now to FIG. 7, there is generally shown at 90 a pixel according to another alternative preferred embodiment of the present invention. Pixel 90 is seen to have a hexagonal shaped mirror 92 supported by a pair of torsion hinges 94 over a pair of addressing electrodes 96 and 98. Each of the hinges 94 is supported by a support post 100 extending upward from a substrate 102. Also supporting mirror 98 is a pair of arcuately shaped flexure hinges 106. Each of flexure hinges 106 is connected to the distal end of mirror 92 at location 108, by a respective member 110. Each member 110 perpendicularly extends from the distal end of mirror 92 each side of the torsion axis defined by hinges 94. Each of hinges 106 is supported at each end by a support post 114 also extending upwardly from substrate 102, as shown.

Pixel 90 is similar to pixels 40 and 70 as shown in FIG. 2 and FIG. 4, respectively, in that the pixel mirror is supported by both the torsion hinges and flexure hinges. The torsion hinges 94 define a torsion axis of rotation, whereby flexure hinges 106 limit the downward flexure of mirror 92 toward either of the addressed electrodes 96 and 98. The geometry of the hexagonal mirror 92 allows the pixels 90 to be arranged in a tightly packed arrangement, such as that shown in FIG. 8. The length of flexure hinges 106 are substantially longer than the length of torsion hinges 94 to provide good flexibility in the hinges 106 and facilitate rotation of the mirror 92 about the torsion axis. the flexure hinges 106 limit the deflection of mirror 92 to prevent shorting of the mirror 92 to the underlying address electrodes 96 and 98.

Figure 8:
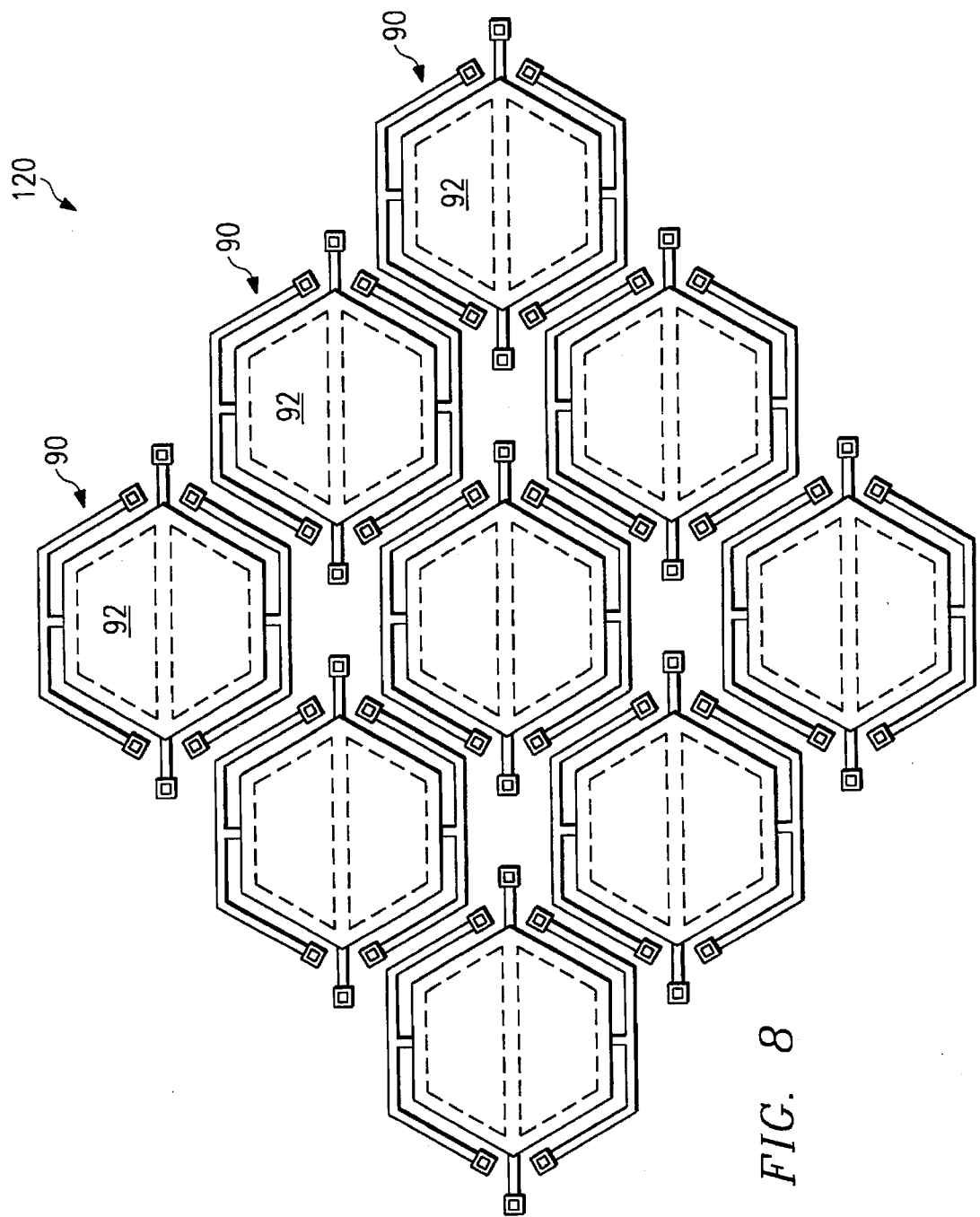
FIG. 8 is a top view of an array of hexagon shaped pixels of FIG. 7 illustrating the tightly packed arrangement of the pixels.

Referring now to FIG. 8, there is shown a spatial light modulator pixel array generally shown at 120. As shown, each of the pixels 90 has a hexagon-shaped mirror 92 oriented to be closely packed with another pixel 90, as shown. In addition, the hexagonal geometry of each mirror 92 closely resembles that of a circle, and is ideally suited to reflect and modulate a beam of light having a circular cross section, such as that from fiber optic devices. Thus, the advantage of the hexagonal shape of mirrors 92 is two fold. First, it facilitates the tightly packed arrangement shown in FIG. 8, and secondly, has a nearly circular surface area to reflect a circular beam of incident light. None of the light-reflecting surface of mirror 92 is wasted, that is, almost the entire surface area of mirror 92 receives and reflects incident light efficiently.

Figure 9:
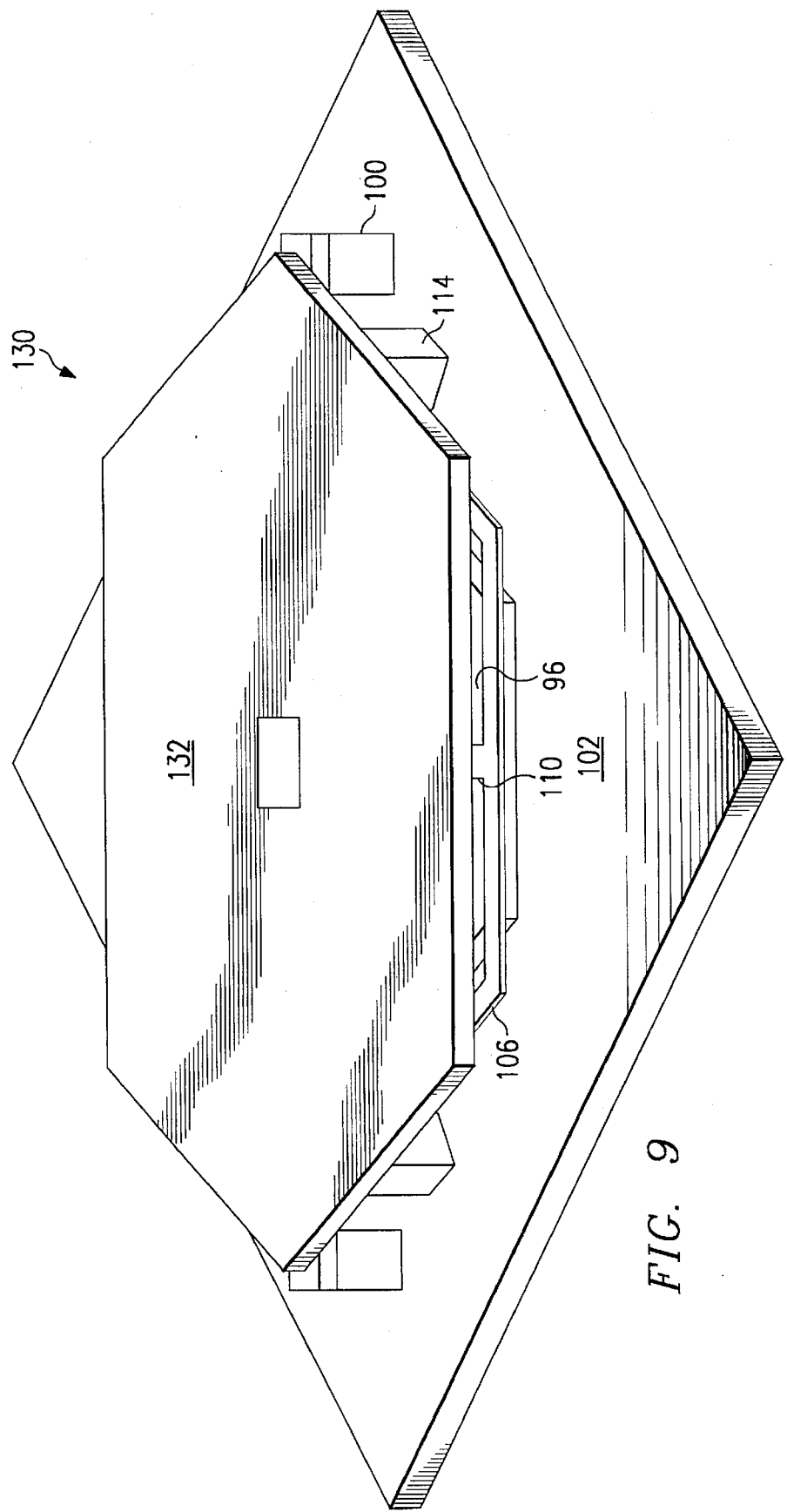
FIG. 9 is a perspective view of a spatial light modulator according to another alternative preferred embodiment of the invention including an hexagon-shaped pixel elevated and overlapping underlying support superstructure.
Figure 10:
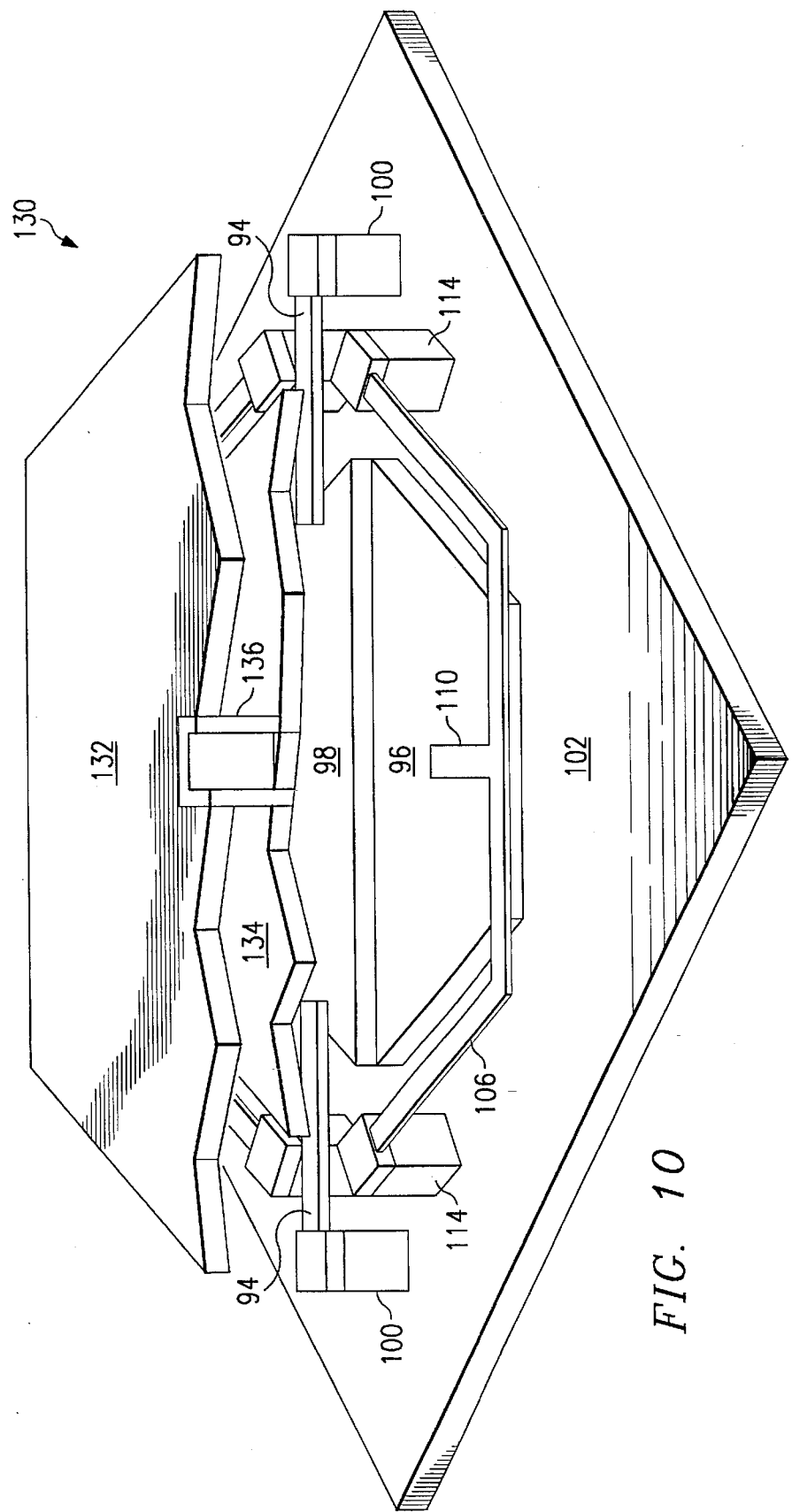
FIG. 10 is a partial cross section of the pixel shown in FIG. 9, illustrating the hexagon mirror supported by the underlying yoke.

Referring now to FIG. 9, there is shown generally at 130 a pixel according to yet another alternative preferred embodiment of the present invention. Pixel 130 is seen to include an elevated hexagonal shaped mirror 132 which substantially encompasses the underlying support structure. Referring to FIG. 10, there is shown a partial cut away view of Pixel 130 to illustrate the underlying yoke 134 which is supported by torsion hinges 94. Yoke 134 is the same size and profile as mirror 92 in FIG. 7, but does not necessarily need a reflective surface. Mirror 132 is supported upon and over yoke 134 by a mirror post 136. Pixel 130, in effect, has a hidden-hinge support superstructure, such as shown in FIG. 10.

Figure 11:
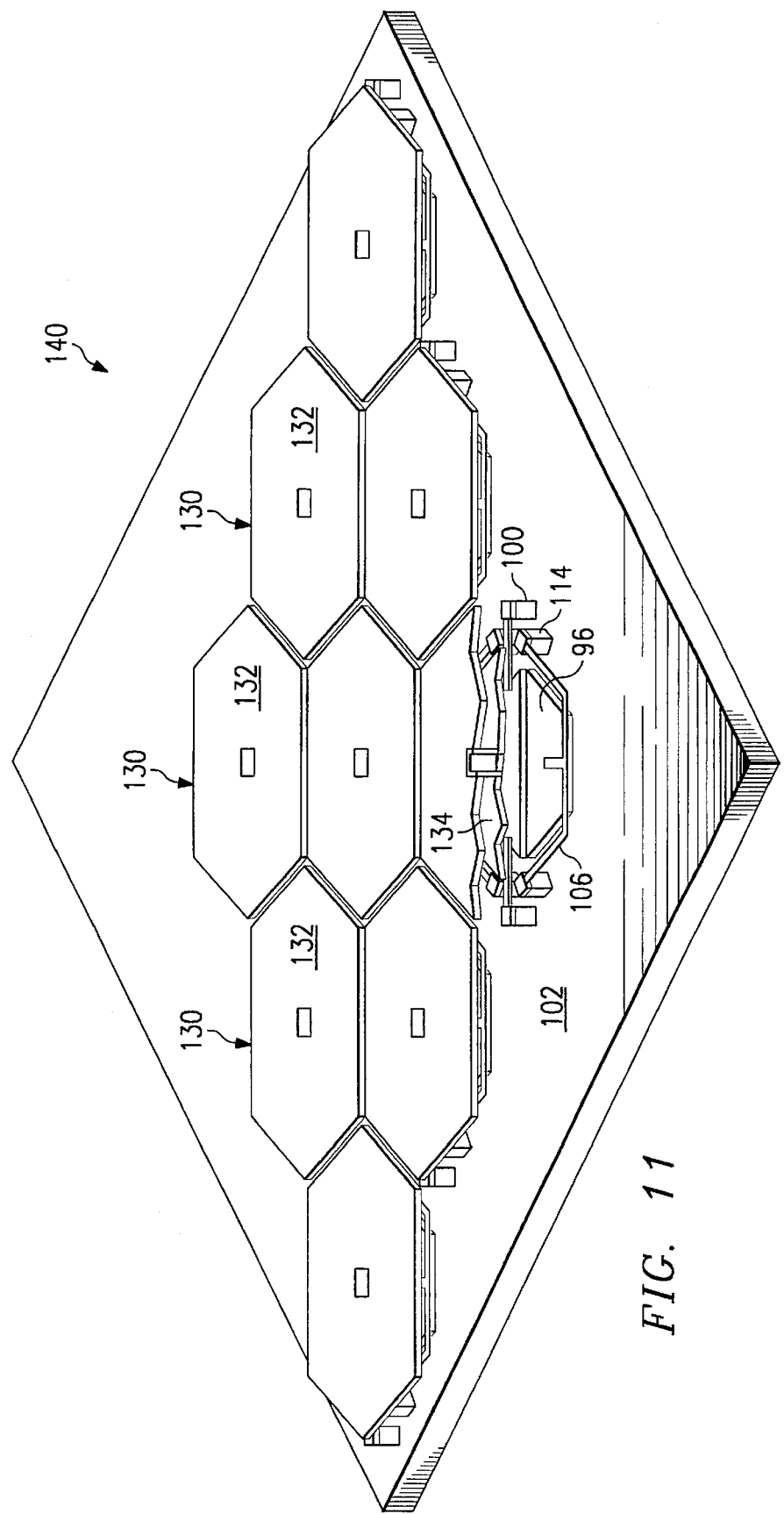
FIG. 11 is a perspective view of an array of pixels comprised of pixels shown in FIG. 9.

The advantages of this embodiment can be appreciated in view of FIG. 11, whereby pixels 130 of an array generally shown at 140 are very tightly packed, allowing for a high density arrangement of pixels 130 with no exposed underlying superstructure. The perimeter edges of pixel mirror 132 extend closely proximate, but spaced from, corresponding edges of the adjacent pixel mirrors 132. The pixels 130 are arranged close enough to one another so as to substantially reduce the possibilities of any incident light from impinging upon and defracting from the underlying support structure of the pixels, such as the torsion hinges 94 or the flexure hinges 106 shown in FIG. 10. Again, the torsion hinges 94 establish the torsion axis about which the yoke 134 and mirror 132 is rotated about, whereby the flexure hinges 106 restrict the rotational deflection of the yoke 134, and hence the mirror 132, about the torsion axis.

For additional discussion and teaching how to fabricate the pixels 130, cross reference is made to commonly assigned co-pending patent application Ser. No. 08/424,021, entitled "Active Yoke Hidden Hinge digital Micromirror Device", which details the hidden hinge structure, the teachings of which incorporated herein by reference.

In summary, an improved monostable spatial light modulator is disclosed that is well suited to operate in the analog mode. Deflection of the pixel is proportional to an electrical signal applied to an underlying address electrode. The deflection and response of the pixel is selectable throughout a large range of applied address voltages. Thus, an incident light beam can be precisely steered to a receiver, such as a sensor or a light scanner. Given the tight process parameter tolerances of conventional semiconductor processing, spatial light modulators with repeatable operating characteristics can be manufactured. The flexure hinges ensure the mirror will resist collapse, contribute to the monostable analog operating characteristics of the mirror, provide a restoring force, and establish mirror levelness in the unaddressed situation. The torsional hinges define the tilt axis, and also provide a restoring force. The present invention can be manufactured using robust manufacturing processes utilized in manufacturing monolithic integrated circuits. The present invention is inexpensive, light weight, and requires low drive power. The deflection speed of the device is very high, with response time of the mirror deflection well suited for high speed optical switching. The surface area of the mirror can be custom designed to have a very small size, such as 17 microns square, but can be relatively large if desired to provide a large area flat pixel for steering large-area light beams. The pixel may have a hexagon-shaped geometry to optically switch an incident circular light beam, such as from fiber optics, and which can be tightly packed in an array of pixels.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A spatial light modulator, comprising:

(a) at least one address electrode on a substrate;

(b) a hexagon-shaped light-reflective pixel positioned over said address electrode which is deflectable out of a first, normal position into a plurality of second positions, light incident on the pixel being selectively modulated by being reflected from the pixel in selected directions depending on the position of the pixel, the position of the pixel being dependent on a selected characteristic of an electrical signal provided to said underlying address electrode;

(c) a first torsion member connected between the pixel and a first stationary post and defining a torsion axis, deflection of the pixel effecting its rotation about the torsional axis of the first member; and (d) a second flexure member connected between the pixel and a second stationary post, deflection of the pixel effecting flexure of the second member.

2. The modulator as set forth in claim 1, wherein:

the points of connection of the members to the pixel are separated about the periphery of the pixel.

3. The modulator as in claim 2, wherein:

the pixel has a generally orthogonal profile, the first member is connected to the pixel at a mid-point of a first side thereof, and the second member is connected to a second side of the pixel.

4. The modulator as in claim 3, wherein:

the second member is connected to the pixel proximate the juncture of the first side of the pixel and the second side of the pixel.

5. The modulator as in claim 2, wherein:

the second member in its unflexed state is oriented so as to be perpendicular to the torsional axis of the first member.

6. The modulator as in claim 5, wherein:

the second member in its flexed state defines a curved surface, the surface of which is generally perpendicular to the torsional axis of the first member.

7. The modulator as in claim 1, wherein:

the characteristics of the first member are such that the deflection of the pixel out of the first position is predominantly rotational about the torsion axis, and the characteristics of the second member are such that the first position of the pixel is predominantly determined by the second member.

8. The modulator as in claim 7, wherein:

the characteristics of the members are such that the pixel is selectively deflectable out of the first position into a plurality of the second positions determined by the voltage of the electrical signal.

9. The modulator as in claim 1, wherein:

the first and second members are respectively connected to separated said first and second posts.

10. The modulator as in claim 1, wherein:

the first and second members are connected to the same said posts.

11. The modulator as in claim 1, wherein:

the pixel is reinforced to maintain flatness.

12. The modulator as in claim 11, wherein:

the pixel is reinforced about a perimeter thereof.

13. The modulator as in claim 12, wherein:

the pixel is corrugated about the perimeter.

14. The modulator as in claim 11, wherein the pixel is radially reinforced from proximate a midsection thereof.

15. The modulator as in claim 1, wherein said pixel comprises a mirror elevated upon and over a yoke, said yoke being supported by said first and second members and said address electrode.

16. The modulator as in claim 1, wherein the length of said second flexure member is substantially longer than the length of said first torsion member.

* * * * *